United States Patent
Koch et al.

(10) Patent No.: US 12,401,358 B1
(45) Date of Patent: Aug. 26, 2025

(54) SHOOT-THROUGH PROTECTION CIRCUIT

(71) Applicant: Aerojet Rocketdyne, Inc., Canoga Park, CA (US)

(72) Inventors: Brian Koch, Redmond, WA (US); Alexandr L. Kristalinski, Redmond, WA (US)

(73) Assignee: Aerojet Rocketdyne, Inc., Melbourne, FL (US)

( * ) Notice: Subject to any disclaimer, the term of this patent is extended or adjusted under 35 U.S.C. 154(b) by 37 days.

(21) Appl. No.: 18/442,524

(22) Filed: Feb. 15, 2024

(51) Int. Cl.
*H03K 17/08* (2006.01)

(52) U.S. Cl.
CPC ..... *H03K 17/08* (2013.01); *H03K 2217/0063* (2013.01); *H03K 2217/0072* (2013.01)

(58) Field of Classification Search
CPC .......... H03K 17/08; H03K 2017/0803; H03K 2217/0063; H03K 2217/0072
USPC .................. 327/108, 109, 509, 588; 363/132
See application file for complete search history.

(56) References Cited

U.S. PATENT DOCUMENTS

| | | | | |
|---|---|---|---|---|
| 2013/0163289 A1* | 6/2013 | Kim | .................. | H03K 17/0412 363/20 |
| 2016/0056817 A1* | 2/2016 | Kinzer | .................. | H10D 84/01 327/109 |
| 2019/0149150 A1* | 5/2019 | Bondade | .................. | H03K 5/08 327/109 |

* cited by examiner

*Primary Examiner* — William Hernandez
(74) *Attorney, Agent, or Firm* — Fox Rothschild LLP; Carol E. Thorstad-Forsyth

(57) ABSTRACT

A circuit comprising: first and second transistors connected in series; a third transistor (TT) comprising a source connected to a source of the second transistor (ST), a gate connected to a gate of ST, and a drain connected to a gate of the first transistor (FT); and a gate driver circuit connected to the gates of FT, ST and TT and configured to provide (i) a first drive signal to the gate of FT to cause FT to transition between an on state and an off state and (ii) a second drive signal to the gates of ST and TT to cause ST and TT to transition between on states and off states. The TT is configured to prevent a shoot-through condition in the circuit by pulling the first drive signal down to a level of the source of the ST when the ST is in the on state.

18 Claims, 8 Drawing Sheets

SHOOT-THROUGH PROTECTION CIRCUIT

STATEMENT REGARDING FEDERALLY SPONSORED RESEARCH

This invention was made with government support under contract FA9300-21-C-6002 awarded by the Air Force Research Laboratory. The government has certain rights in the invention.

BACKGROUND

Description of the Related Art

Electrical circuits, such as those used in satellites and spacecraft, include many different power requirements. Converting from direct current (DC) to alternating current (AC) and DC to DC involves bridge circuits which utilize two pairs of serially arranged transistors alternately switched to provide proper power conversion. Each serially arranged transistor pair includes an upper switch and a lower switch. Shoot-through or short circuit in the circuit occurs when both upper and lower switches turn on simultaneously. This could happen, for example in space applications, as a result of high energy particles hitting drive circuit components. The duration of such condition could reach 10 µs resulting in overheating and failure of the affected switches.

SUMMARY

This document concerns a circuit comprising: first and second transistors connected in series; a third transistor comprising a source connected to a source of the second transistor, a gate connected to a gate of the second transistor, and a drain connected to a gate of the first transistor; and a gate driver circuit connected to the gates of the first, second and third transistors and configured to provide (i) a first drive signal to the gate of the first transistor to cause the first transistor to transition between an on state and an off state and (ii) a second drive signal to the gates of the second and third transistors to cause the second and third transistors to transition between on states and off states. The third transistor is configured to prevent a shoot-through condition in the circuit by pulling the first drive signal down to a level of the source of the second transistor when the second transistor is in the on state.

This document concerns implementing systems and methods for operating a circuit. The methods comprise: providing, by a gate driver circuit, a first high drive signal to a gate of a first transistor and a first low drive signal to a gate of a second transistor and a gate of a third transistor that is connected in series with the first transistor (whereby the first transistor is transitioned to an on state and the second and third transistors are transitioned to off states); providing a second high drive signal from the gate driver circuit concurrently to the gates of the second and third transistors to cause the second and third transistors to transition from the off states to on states while the first transistor is still in the on state; and using the second transistor to prevent a shoot-through condition by pulling down a voltage of the first high drive signal being output from the gate driver circuit to a level that causes the first transistor to transition from the on state to an off state while the third transistor is in the on state.

This document further concerns a circuit, comprising: first and second transistors of a P-channel type connected in series; a third transistor comprising a source connected to a source of the second transistor, a gate connected to a gate of the second transistor, and a drain connected to a gate of the first transistor; and gate driver circuits connected to the gates of the first, second and third transistors and configured to provide (i) a first drive signal to the gate of the first transistor to cause the first transistor to transition between an on state and an off state and (ii) a second drive signal to the gates of the second and third transistors to cause the second and third transistors to transition between on states and off states. The third transistor is also a P-channel type that is configured to prevent a shoot-through condition in the circuit by pulling the first drive signal up to a level of the source of the second transistor when the second transistor is in the on state.

BRIEF DESCRIPTION OF THE DRAWINGS

This disclosure is facilitated by reference to the following drawing figures, in which like numerals represent like items throughout the figures.

DETAILED DESCRIPTION

Figure 1:
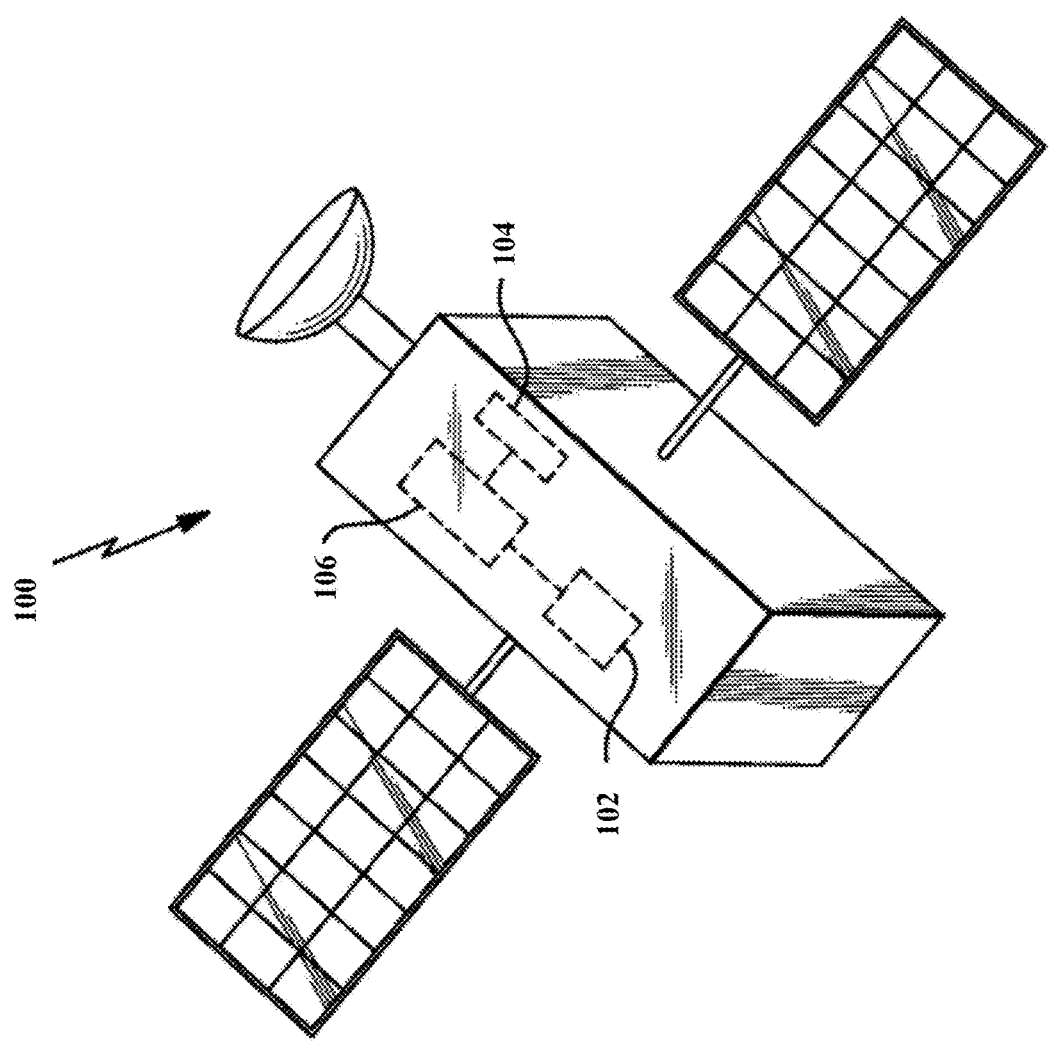
FIG. 1 provides an illustration of a satellite.

It will be readily understood that the solution described herein and illustrated in the appended figures could involve a wide variety of different configurations. Thus, the following more detailed description, as represented in the figures, is not intended to limit the scope of the present disclosure but is merely representative of certain implementations in different scenarios. While the various aspects are presented in the drawings, the drawings are not necessarily drawn to scale unless specifically indicated.

The present solution may be embodied in other specific forms without departing from its spirit or essential characteristics. The described embodiments are to be considered in all respects only as illustrative and not restrictive. The scope of the present solution is, therefore, indicated by the appended claims rather than by this detailed description. All changes which come within the meaning and range of equivalency of the claims are to be embraced within their scope.

Reference throughout this specification to features, advantages, or similar language does not imply that all the features and advantages that may be realized should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout the specification may, but do not necessarily, refer to the same embodiment.

Reference throughout this specification to "one embodiment", "an embodiment", or similar language means that a particular feature, structure, or characteristic described in connection with the indicated embodiment is included in at least one embodiment of the present solution. Thus, the phrases "in one embodiment", "in an embodiment", and similar language throughout this specification may, but do not necessarily, all refer to the same embodiment.

As used in this document, the singular form "a", "an", and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to".

In this document, when terms such as "first" and "second" are used to modify a noun, such use is simply intended to distinguish one item from another, and is not intended to require a sequential order unless specifically stated.

As noted above, shoot-through or short circuit in a bridge converter occurs when both upper and lower switches turn on simultaneously. This could happen, for example in space applications, as a result of high energy particles hitting drive circuit components. Noise and other events could additionally or alternatively cause the shoot-through condition. The duration of such shoot-through condition could reach 10 μs resulting in overheating and failure of the affected switches. Shoot-through protection is usually based on a very fast acting current sense circuit. The current sense circuit is often connected in series with the transistors of the bridge converter below the lower transistor. The current sense circuit is specifically designed to be insensitive to the normal currents so that it detects only relatively high currents that exceed threshold(s). The current sense circuit increases complexity, mass and cost of the bridge converter.

The present solution provides a novel shoot-through protection circuit that addresses the drawbacks of the conventional current sense solutions. The present solution can be used in various applications. Such applications include, but are not limited to, transistor active bridge applications, transistor bridge converter applications, transistor switching circuit applications, and/or any other application shoot-through protection is needed. The present solution can be used in transistor circuits designed for terrestrial applications, aerial applications and/or space applications.

FIG. 1 provides an illustration of a satellite 100 implementing the present solution. Satellite 100 comprises a power source 102 providing power to a load 104 through a power distribution circuit 106. The load 104 can include, but is not limited to, an electric propulsion unit. Transistor active bridge circuit(s) is(are) employed in the power distribution circuit 106 to condition and distribute power from the power sources 102 to the load 104. The power distribution circuit 106 can experience damage when a shoot-through overcurrent condition occurs in the transistor active bridge circuit(s). The present solution can be added to the transistor active bridge circuit for protecting the power distribution circuit 106. The present solution will now be discussed in detail below. However, an illustrative architecture for a transistor active bridge circuit will first be briefly discussed.

Figure 2:
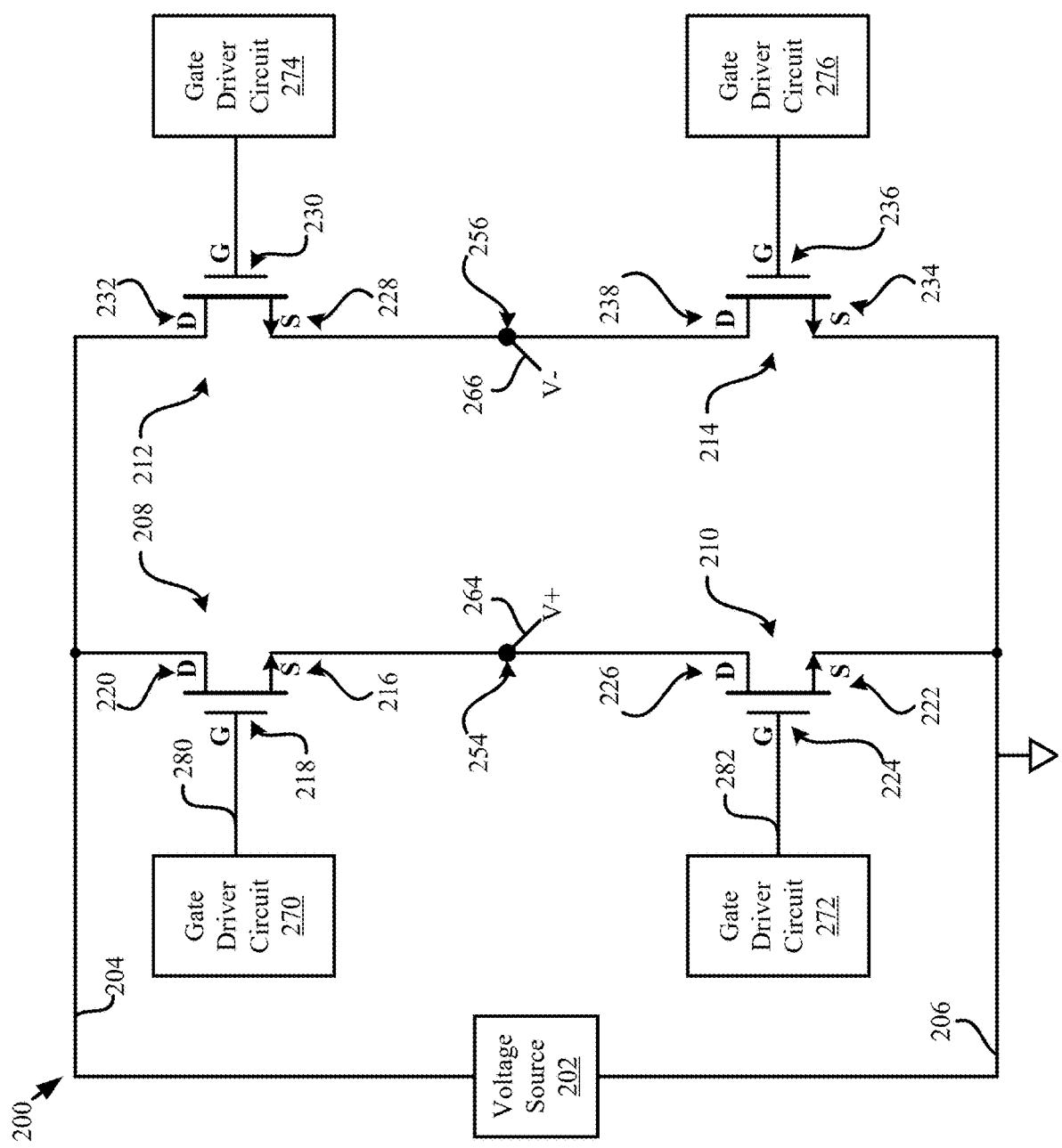
FIG. 2 provides a diagram of a transistor active bridge circuit.

FIG. 2 provides a diagram for the illustrative architecture of a transistor active bridge circuit 200. The transistor active bridge circuit 200 is useful for a variety of purposes, including AC-to-DC conversion or DC-to-DC conversion. As may be observed in FIG. 2, the transistor active bridge circuit 200 is supplied a voltage waveform. The voltage waveform can be an AC voltage waveform or a DC voltage waveform. As such, the transistor active bridge circuit 200 is connectable to at least one voltage source 202 via two (2) input lines 204, 206. The transistor active bridge circuit 200 is also connected between a pair of output lines 264, 266. The output lines 264, 266 can be connected across a load (e.g., load 104 of FIG. 1) so that the load can be supplied an output voltage by the transistor active bridge circuit 200.

Figure 8:
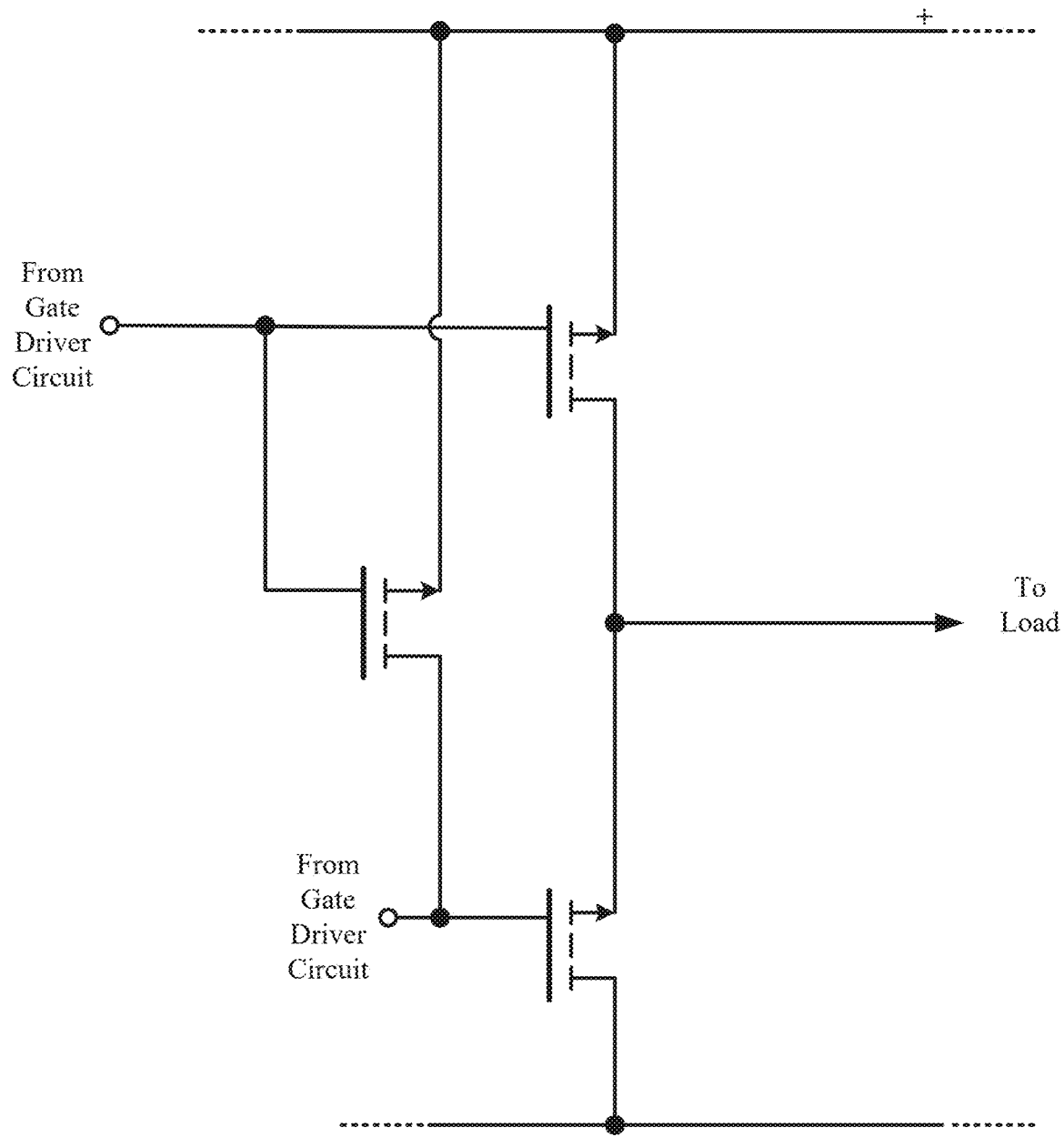

The transistor active bridge circuit 200 includes a plurality of field-effect transistors (FETs) 208, 210, 212, 214 of an N-channel type (as shown in FIG. 2) or a P-channel type (as shown in FIG. 8). Each of the FETs may comprise a metal-oxide semiconductor FET (MOSFET). The MOSFET may be an enhancement mode MOSFET. Each FET 208, 210, 212, 214 can include, but is not limited to, a gallium nitride FET. In some scenarios, each FET 208, 210, 212, 214 is selected to comprise a transistor having a part number EPC7020 available from EPC Space LLC of Andover, Massachusetts. Other FETs can also be selected depending upon the anticipated voltage and current handling requirements of the transistor active bridge circuit 200. A similar shoot through protection (both for N-channel and P-channel) can be achieved with Bi-polar Junction Transistors (BJT) (both NPN and PNP) and an insulated-gate bipolar transistor (IGBT) for the third switch (an FET rather that IGBT may be used in that case).

Each FET 208, 210, 212, 214 has three (3) terminals respectively defined as a source, a gate and a drain. With regard to FET 208, the source, gate and drain terminals are respectively identified with reference numbers 216, 218 and 220. With regard to FET 210, the source, gate and drain terminals are respectively identified with reference numbers 222, 224 and 226. The source, gate and drain terminals of the FETs 212 and 214 are respectively identified as 228, 230, 232 and 234, 236, 238.

An electrical path is provided from the source to the drain of each FET 208, 210, 212, 214. This path is generally referred to herein as the source-drain path. A source-drain path of first FET 208 is connected in series with a source-drain path of the second FET 210. The series connected transistor pair 208, 210 form a first series transistor combination that is connected across the input lines 204, 206. A source-drain path of the third FET 212 is connected in series with a source-drain path of the fourth FET 214 to form a second series transistor combination connected across the input lines 204, 206.

The transistor active bridge circuit 200 can have an output defined by output lines 264, 266. A first one of the output lines 264 can be connected to the first series combination 208, 210 at an interconnection point 254 between the first and the second field-effect transistors 208, 210. A second one of the output lines 266 can be connected to the second series combination 212, 214 at an interconnection point 256 between the third and fourth field-effect transistors 212, 214.

A gate driver circuit 270, 272, 274, 276 is provided for each FET 208, 210, 212, 214. Each gate driver circuit 270, 272, 274, 276 is generally configured to supply a voltage to the gate 218, 224, 230, 236 of a respective FET 208, 210, 212, 214 at certain times for switching the FET to its "on" state or "off" state. The voltage applied to the gate 218, 224, 230, 236 of a respective FET 208, 210, 212, 214 has an "on state" or "off state" voltage value selected in accordance with a particular field-effect transistor application. Each gate driver circuit 270, 272, 274, 276 is also generally configured to stop supplying the voltage to the gate 218, 224, 230, 234 of a respective FET 208, 210, 212, 214 at certain times for switching the FET to its "on" state or "off" state. Gate driver circuits are well known. Known or to be known gate driver circuit can be used here.

The transistor active bridge circuit 200 further include devices for ensuring that each of the FETs 202, 204, 206, 208 is switched to its "on" states and/or "off" states at desirable times.

The operation of the transistor active bridge circuit 200 will now be described. In some scenarios, one FET is switched to its "on" state while the other three FETs are in their "off" states. In other scenarios, two FETs (one in each series pair of transistors) are concurrently or simultaneously switched to their "on" states while the other two FETs are in their "off" states. The latter case will be discussed in more detail below.

When the gate driver circuits 270, 276 communicate a gate control signal to the FETs 208, 214, the FETs 208, 214 will be biased and switch to their "on" states. In effect, current will flow between the drain 220, 238 and source 216, 234 of these FETs 208, 214. The FETs 208, 214 transition back to their "off" states when the gate control signal is no longer being output from the gate driver circuits 270, 276.

Similarly, the gate driver circuits 272, 274 communicate a gate control signal to the FETs 210, 212, the FETs 210, 212 will be biased and switched to their "on" states. In effect, current will flow between the drain 226, 232 and source 222, 228 of these FETs 208, 214. The FETs 210, 212 transition back to their "off" states when the gate control signal is no longer being output from the gate driver circuits 272, 274.

The gate driver circuits 270, 272, 274, 276 are configured to prevent the two FETs in each series pair 208/210 and 212/214 from being turned "on" simultaneously or concurrently. The FETs 208, 210, 212, 214 are switched alternatively by the gate driver circuits 270, 272, 274, 276 to provide a certain power output across output lines 264, 266.

However, for example as a result of high energy particles hitting the gate driver circuits, both FETs in one or more pairs may be turned "on" simultaneously or concurrently. In this case, a shoot-through condition occurs in the transistor active bridge circuit 200. The duration of such condition may result in overheating or failure of the affected FETs.

The present solution addresses this shoot-through issue by adding an additional switch to each pair of FETs. The present solution will be discussed below in relation to a single pair of the FETs. This discussion is sufficient for understanding the present solution in relation to both pairs of FETs in the transistor active bridge circuit 200.

Figure 3:
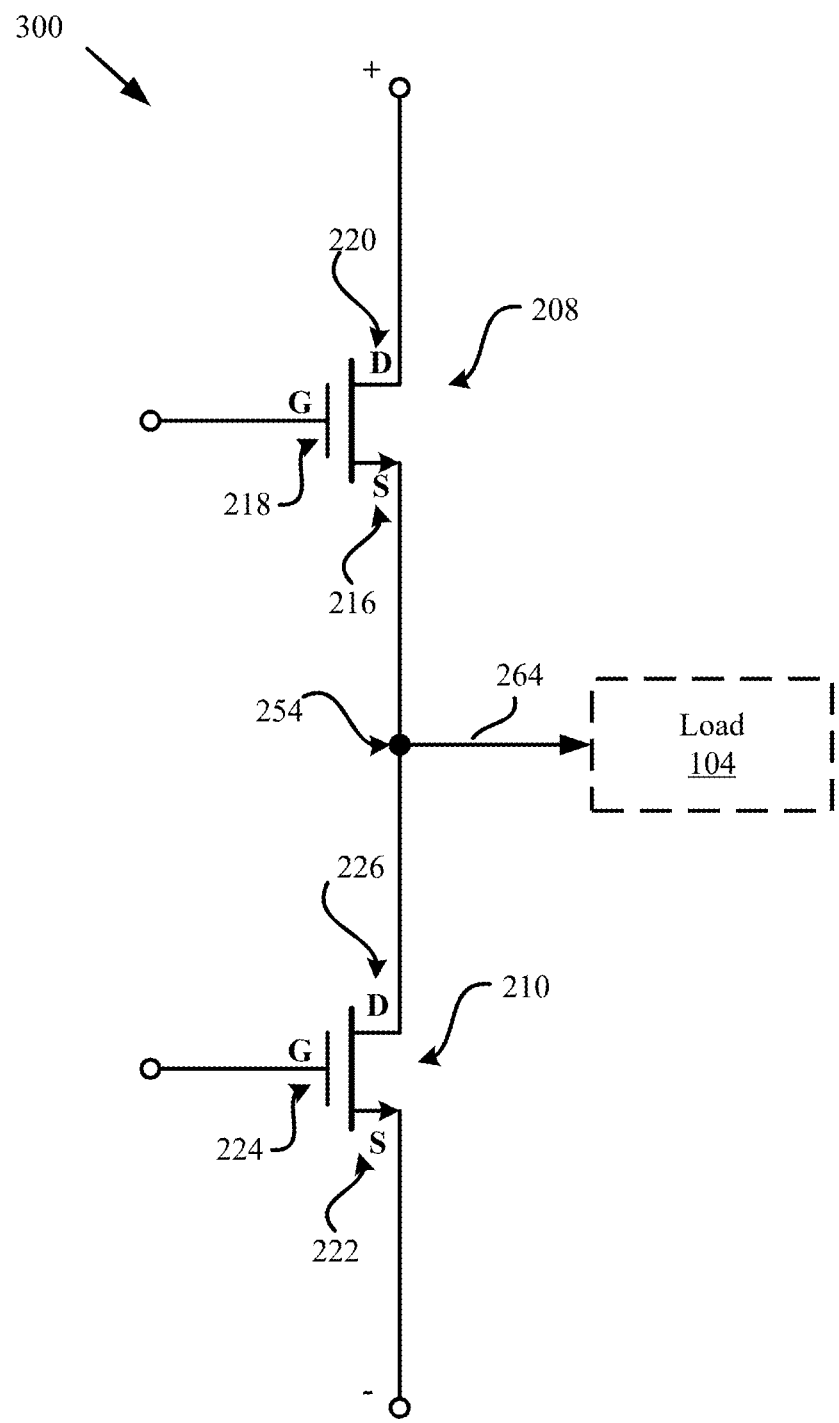
FIG. 3 provides a diagram of a pair of series transistors.

A pair of FETs 300 is shown in FIG. 3 as comprising FETs 208 and 210 of FIG. 2. The present solution is not limited in this regard. The pair of FETs could alternatively comprise FETs 212, 214 of FIG. 2 or other types of FETs. The present solution will be described below in relation to the pair of FETs 300. This description is sufficient for understanding the present solution in relation to FETs 212, 214 of FIG. 2 or other types of FETs.

Figure 4:
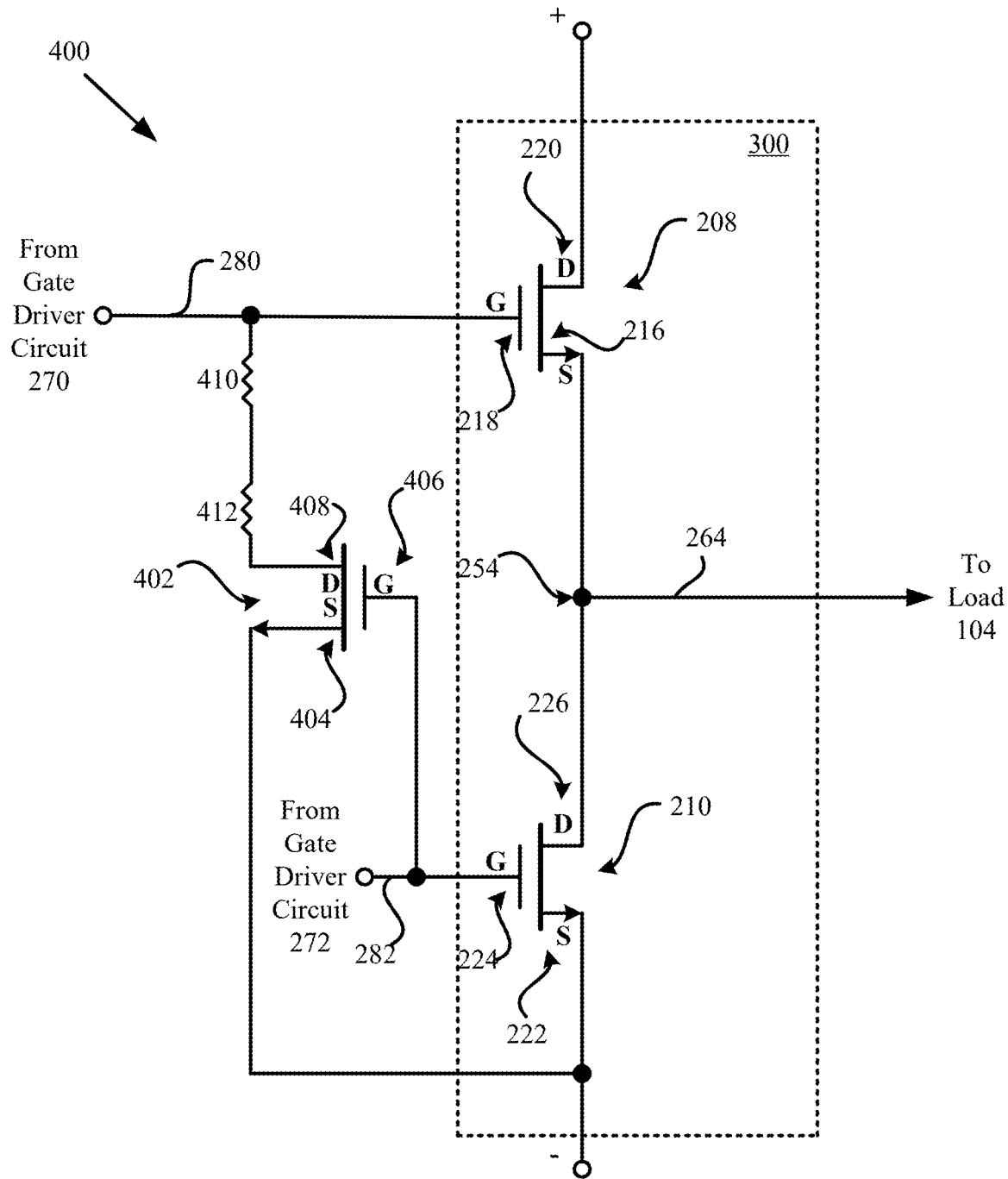
FIGS. 4-5 and 8 each provides a diagram of the pair of series transistors shown in FIG. 3 with shoot-through protection.

FIG. 4 provides an illustration of a circuit 400 comprising shoot-through protection for the pair of FETs 300. The shoot-through protection is provided by the inclusion of a transistor 402 that is configured to prevent a voltage at gate 218 of the upper switch 208 from being positive with respect to the source 216 of the upper switch 208 when gate 224 of the lower switch 210 is positive with respect to the source 222 of the lower switch 210.

Transistor 402 includes a FET of an N-channel type (as shown in FIG. 4) or a P-channel type (as shown in FIG. 8). FET 402 may comprise a MOSFET. The MOSFET may be an enhancement mode MOSFET. FET 402 can include, but is not limited to, a gallium nitride FET. FET 402 has three (3) terminals respectively defined as a source, a gate and a drain. With regard to FET 402, the source, gate and drain terminals are respectively identified with reference numbers 404, 406 and 408. Source 404 is connected to the source 222 of FET 210. Gate 406 is connected to the drive line 282 extending from an output of the gate driver circuit 272 and the gate of lower FET 210 of the pair 400. Drain 408 is connected to the drive line 280 extending from an output of the gate driver circuit 270 and the gate 218 of the upper FET 208 of the pair 400. Optional resistors 410, 412 may be provided between the drain 408 of FET 402 and the gate 218 of FET 208 to limit or regulate the flow of current.

During operation, a high drive signal is provided from the gate driver circuit 270 to the gate 218 of upper FET 208 in the series pair and a low drive signal is provided from the gate driver circuit 272 to the gate 224 of the lower FET 210 in the series pair. Accordingly, the upper FET 208 is in an "on" state while the lower FET 210 is in an "off" state. It should be noted that the low drive signal is also provided from the gate driver circuit 272 to the gate 406 of the shoot-through protection FET 402. As such, the shoot-through protection FET 402 is in the "off" state while the upper FET 208 is in the "on" state and the lower FET 210 is in the "off" state.

If an event occurs (e.g., noise or a high radiation event) that causes the gate driver circuit 272 to provide a high drive signal to the gate 224 of the lower FET 210, then FET 210 transitions from the "off" state to the "on" state whereby a shoot-through condition occurs since both series FETs 208, 210 are in the "on" state at the same time.

Notably, the high drive signal is also provided from the gate driver circuit 272 to the gate 406 of the shoot-through protection FET 402. Responsive to the high drive signal, the shoot-through protection FET 402 transitions to the "on" state. At this time, the shoot-through protection FET 402 pulls down the drive signal being supplied to the gate 218 of the upper FET 208. In effect, a low drive signal is now provided to the gate 218 of the upper FET 208 despite the gate driver circuit 270 still being configured to continue output of a high drive signal on drive line 280. The low drive signal at gate 218 causes the upper FET 208 to transition to the "off" state while the lower FET 210 remains in the "on" state. This prevents any potential damage to the upper and lower FETs 208, 210 by actively removing, discontinuing or preventing the shoot-through condition.

In another scenario, a high drive signal is provided from the gate driver circuit 272 to the gate 224 of the lower FET 210 and a low drive signal is provided from the gate driver circuit 270 to the gate 218 of the upper FET 208. At this time, the lower FET 210 is in the "on" state while the upper FET 208 is in the "off" state. Notably, the high drive signal is also being provided from the gate driver circuit 272 to the gate 406 of the shoot-through protection FET 402. The shoot-through protection FET 402 is in the "on" state thereby preventing a high drive signal from being provided at the gate 218 of the upper FET 208. Stated differently, the shoot-through protection FET 402 prevents the upper FET 208 from being turned "on" while the lower FET 210 is in the "on" state.

As evident from the above discussion, the shoot-through protection FET 402 guarantees that a low drive signal is always provided to the gate 218 of the upper FET 208 whenever the lower FET 210 is in the "on" state. This is achieved by pulling the gate 218 of the upper FET 208 down to a level of the source 222 of the lower FET 210 whenever the lower FET 210 is in the "on" state. This feature of the shoot-through protection FET 402 reduces or eliminate the probability that the series FETs 208, 210 will be damaged during operation of the circuit 400.

Figure 5:
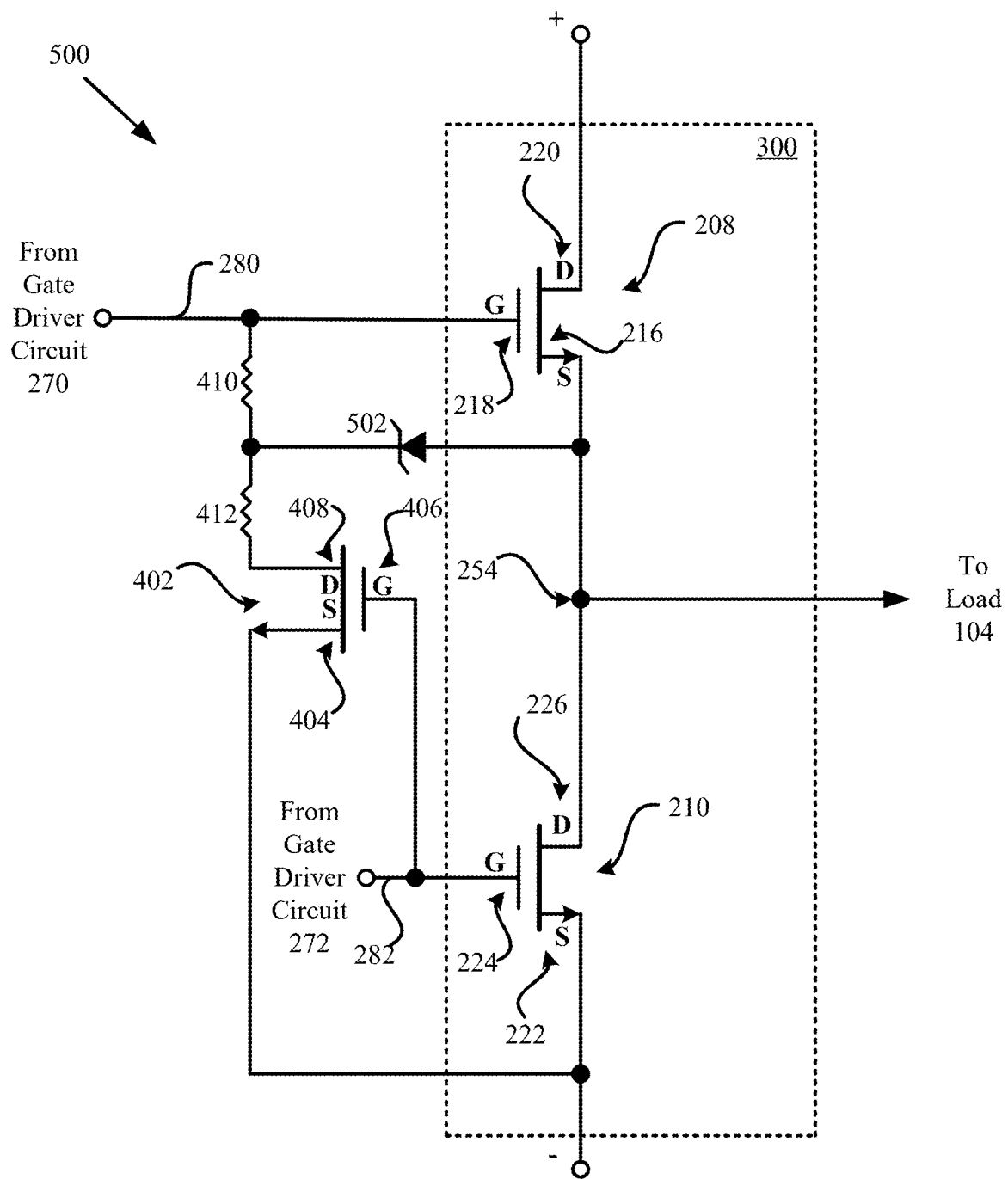

FIG. 5 provides an illustration of a circuit 500 comprising shoot-through protection for the pair of FETs 300. The shoot-through protection is provided by the inclusion of a transistor 402 that is configured to prevent a voltage at gate 218 of the upper switch 208 from being positive with respect to the source 216 of the upper switch 208 when gate 224 of the lower switch 210 is positive with respect to the source 222 of the lower switch 210. Circuit 500 is similar to circuit 400 except for the inclusion of an additional optional diode 502. Diode 502 may include, but is not limited to, a Schottky diode. Diode 502 is provided to limit the negative voltage at the gate 218 of the upper FET 208 with respect to the source 216 of the upper FET 208.

Diode 502 may be provided based on the relative speed of "on/off" state transitions by the FETs 208, 210, 402. For example, if FET 402 is relatively fast and transistors 208, 210 are relatively slow, then it may cause an undesirable condition in which the gate 218 of the upper FET 208 is pulled low but the source 216 is still high. The diode 502 prevents such an undesirable condition by ensuring that the gate 218 and source 216 are concurrently pulled low by the transistor 402.

Figure 6:
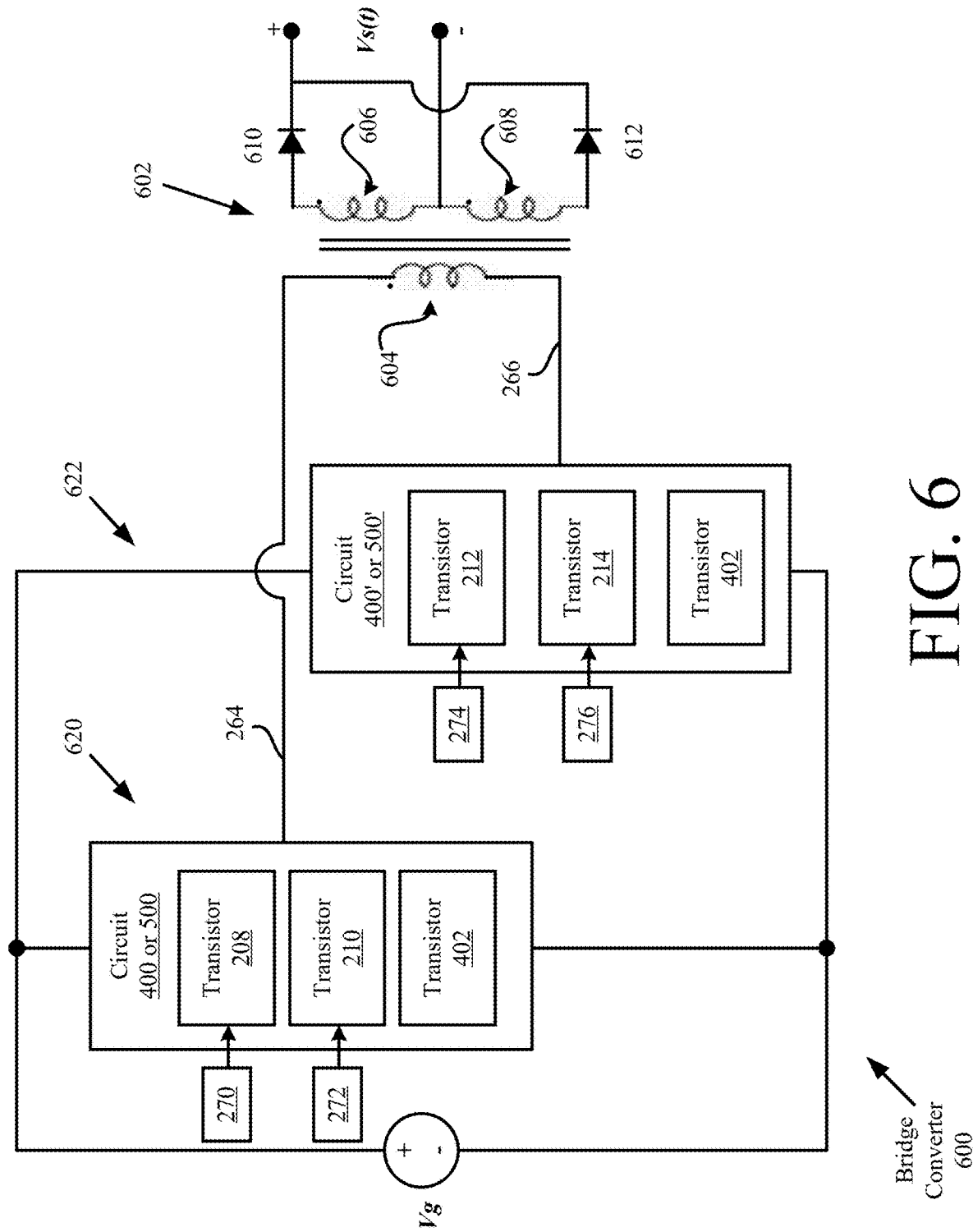
FIG. 6 provides a diagram of a bridge converter implementing the present solution.

FIG. 6 provides an illustration of a bridge converter 600 implementing the present solution. The bridge converter 600 comprises a transistor active bridge circuit electrically coupled to a transformer 602 having a primary winding 604 connected to the output lines 264, 266 thereof. The transistor active bridge circuit may comprise transistor active bridge circuit 200 of FIG. 2 which has been modified to comprise the shoot through protection circuits of FIG. 4 and/or FIG. 5. In this regard, each branch 620, 622 of the transistor active bridge circuit comprises a pair of series transistors 208/210 or 212/214 and at least a shoot-through protection transistor 402. Thus, branch 620 includes circuit 400 of FIG. 4 or circuit 500 of FIG. 5. Branch 622 includes either (i) circuit 400' which is similar to or the same as circuit 400 except for the replacement of series transistors 208, 210 with series transistors 212, 214 or (ii) circuit 500' which is similar to or the same as circuit 500 except for the replacement of series transistors 208, 210 with series transistors 212, 214.

During operation, the two series pairs of FETs 208/210, 212/214 are used to drive the transformer's primary winding 604 symmetrically. FET 208 and FET 214 conduct in a first switching period and the other FETs 210, 212 conduct during the next switching period. As one set of FETs (e.g., FETs 208, 214) conducts, the other set of FETs (e.g., FETs 210, 212) remains in the "off" state. The output voltage Vs(t) is determined by the transistor duty cycle, the transformer's turn ratio, and the input voltage Vg.

Figure 7:
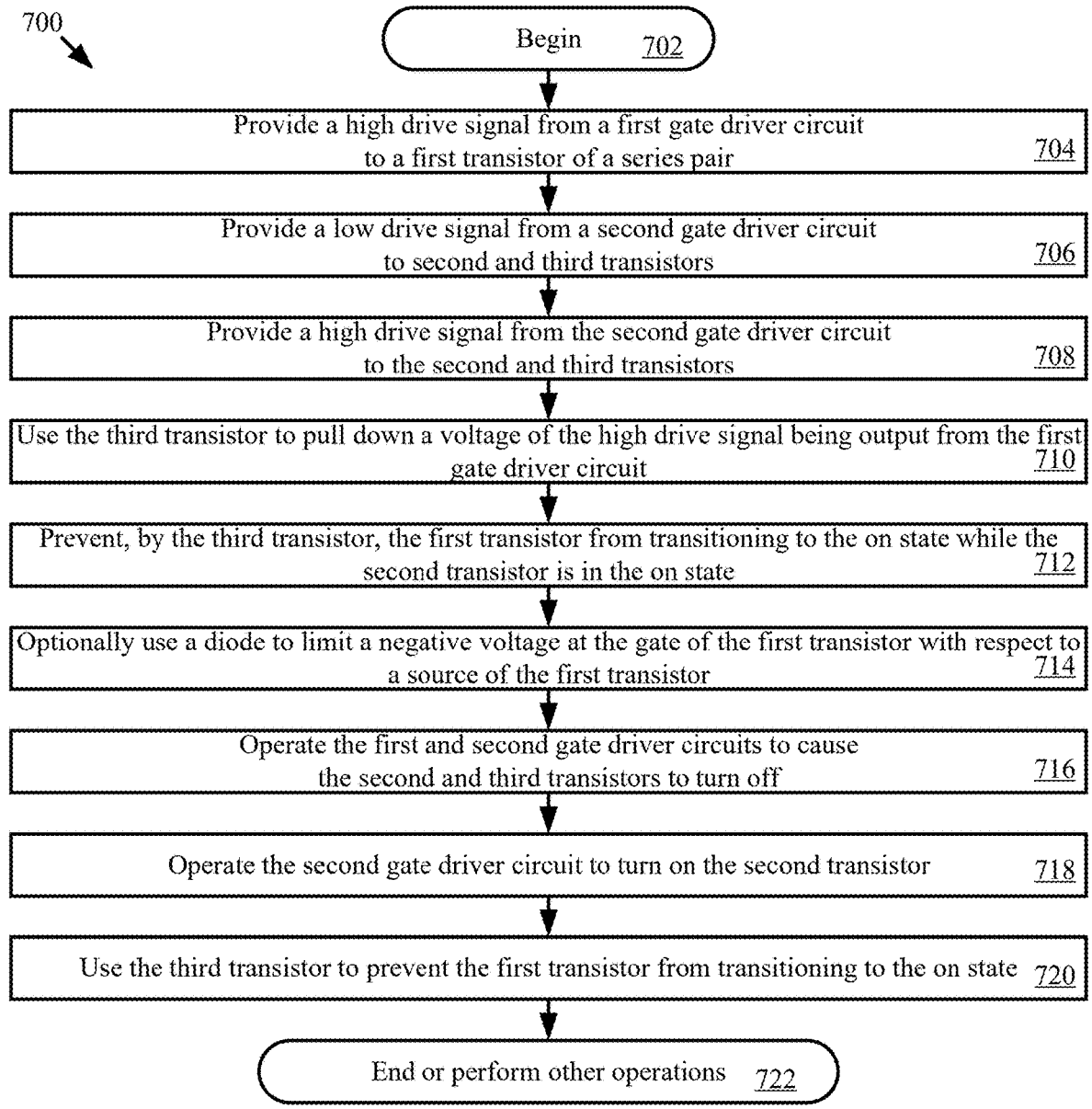
FIG. 7 provides a flow diagram of a method for operating a circuit.

FIG. 7 provides a flow diagram of an illustrative method 700 for operating a circuit. Method 700 begins with 702 and continues with 704 where a first high drive signal is provided from a first gate driver circuit (e.g., gate driver circuit 270 or 274 of FIG. 2) to a gate (e.g., gate 218 or 230 of FIG. 2) of a first transistor (e.g., transistor 208 or 212 of FIG. 2). A first low drive signal is provided from a second gate driver circuit (e.g., gate driver circuit 272 or 276 of FIG. 2) to a gate (e.g., gate 406 of FIGS. 4-5) of a third transistor and a gate of a second transistor (e.g., gate 224 or 236 of FIG. 2), as shown by block 706. The first and second gate driver circuits may comprise sub-circuits of a gate driver circuit. The second transistor is connected in series with the first transistor across first and second input lines (e.g., input lines 204, 206 of FIG. 2). The first transistor is transitioned to its on state in block 704 and the second and third transistors are transitioned to their off states in block 706. The operations of blocks 704, 706 may occur simultaneously or concurrently rather than serially as shown in FIG. 7. The first, second and/or third transistors may include, but are not limited to, gallium nitride field effect transistors.

In next block 708, a second high drive signal is provided from a second gate driver circuit (e.g., gate driver circuit 272 or 276 of FIG. 2) concurrently to the gates (e.g., gate 406 of FIG. 4 and gate 224 or 236 of FIG. 2) of the second and third transistors (e.g., transistor 402 of FIG. 4 and transistor 210 or 214 of FIG. 2). The second high drive signal may be provided from the second driver circuit responsive to a radiation or noise event in a surrounding environment. The second high drive signal causes the second and third transistors to transition from the off states to on states while the first transistor is still in the on state.

In blocks 710, the third transistor is used to prevent a shoot-through condition. The third transistor operates to pull down a voltage of the first high drive signal being output from the first gate driver circuit to a level that causes the first transistor to transition from the on state to an off state while the second transistor is in the on state. The third transistor also operates in 712 to prevent the first transistor from transitioning to the on state while the second transistor is in the on state.

In block 714, a diode (e.g., diode 502 of FIG. 5) is optionally used to limit a negative voltage at the gate of the first transistor with respect to a source of the first transistor while the third transistor is being used to prevent the shoot-through condition. The diode may be selectively provided in the circuit based on relative state transition speeds of the first, second and third transistors.

In block 716, the first and second gate driver circuits are operated to cause the second and third transistors to turn off. Thereafter, the first and second gate driver circuits may be operated in block 718 to cause the second transistor to transition to the on state while the first transistor is in the off state. The third transistor is used in 720 to prevent the first transistor from being transitioned from the off state to the on state, for example, when a radiation or noise event occurs in a surrounding environment which impacts operation of the first gate driver circuit. Subsequently, method 700 continues to block 722 where it ends or other operations are performed (e.g., return to block 702).

In view of the forgoing, the present document concerns a circuit (e.g., circuit 400 of FIG. 4, 500 of FIGS. 5 and/or 600 of FIG. 6) comprising: first and second transistors (e.g., transistors 208, 210 or 212, 214) connected in series across first and second input lines (e.g., input lines 204, 206) of the circuit; a third transistor (e.g., transistor 402) comprising a source (e.g., source 404) connected to a source (e.g., source 222 or 236) of the second transistor, a gate (e.g., gate 406) connected to a gate (e.g., gate 224 or 234) of the second transistor, and a drain (e.g., drain 408) connected to a gate (e.g., gate 218 or 230) of the first transistor; and a gate driver circuit (e.g., circuit 270/272 or 274/276) connected to the gates of the first, second and third transistors and configured to provide (i) a first drive signal to the gate of the first transistor to cause the first transistor to transition between an on state and an off state and (ii) a second drive signal to the gates of the second and third transistors to cause the second and third transistors to transition between on states and off states. The third transistor is configured to prevent a shoot-through condition in the circuit by pulling the first drive signal down to a level of the source of the second transistor when the second transistor is in the on state. The third transistor is also configured to prevent the first transistor from transitioning from the off state to the on state while the third transistor is in the on state.

In some scenarios, the first transistor is in the on state when the first gate drive signal has a first voltage value and the second and third transistors are in the off states when the second gate drive signal has a second voltage value lower than the first voltage value. The gate drive circuit may be caused, by a radiation event occurring in a surrounding environment, to increase the second voltage value of the second gate drive signal. The third transistor prevents the shoot-through condition when the second gate drive signal has the increased second voltage value.

The circuit may further comprise a diode (e.g., diode 502) configured to limit a negative voltage at the gate of the first transistor with respect to a source of the second transistor while the third transistor is being used to prevent the shoot-through condition. The diode may be selectively provided in the circuit based on relative state transition speeds of the first, second and third transistors.

In those or other scenarios, the gate driver circuits is operable to cause the third transistor to be in the on state while the first transistor is in the off state. The third transistor is configured to prevent the first transistor from being transitioned from the off state to the on state when a radiation event occurs in a surrounding environment which impacts operation of the gate driver circuit.

In those or other scenarios, the first, second and third transistors are bipolar junction transistors with emitters replacing sources, collectors replacing drains, and bases replacing gates. Alternatively, the first and second transistors are insulated-gate bipolar transistors with emitters replacing sources, collectors replacing drains, and the third transistor comprise a field effect transistor.

This document also concerns a method for operating a circuit. The method comprises: providing a first high drive signal from a first gate driver circuit to a gate of a first transistor and a first low drive signal from a second gate driver circuit to a gate of a second transistor and a gate of a third transistor that is connected in series with the first transistor across first and second input lines, whereby the first transistor is transitioned to an on state and the second and third transistors are transitioned to off states; providing a second high drive signal from the second gate driver circuit concurrently to the gates of the second and third transistors to cause the second and third transistors to transition from the off states to on states while the first transistor is still in the on state; and using the second transistor to prevent a shoot-through condition by pulling down a voltage of the first high drive signal being output from the first gate driver circuit to a level that causes the first transistor to transition from the on state to an off state while the third transistor is in the on state. The second high drive signal may be provided from the second driver circuit responsive to a radiation event in a surrounding environment. The second transistor can include, but is not limited to, a gallium nitride field effect transistor. The method may also comprise preventing, by the second transistor, the first transistor from transitioning from the off state to the on state while the third transistor is in the on state.

The method may further comprise: selectively providing the diode in the circuit based on relative state transition speeds of the first, second and third transistors; and/or using the diode to limit a negative voltage at the gate of the first transistor with respect to a source of the third transistor while the second transistor is being used to prevent the shoot-through condition.

Additionally or alternatively, the method comprises: operating the first and second gate driver circuits to cause the third transistor to be in the on state while the first transistor is in the off state; and/or using the second transistor to prevent the first transistor from being transitioned from the off state to the on state when a radiation event occurs in a surrounding environment which impacts operation of the first gate driver circuit.

The present document also concerns a circuit, comprising: first and second transistors of a P-channel type connected in series; a third transistor comprising a source connected to a source of the second transistor, a gate connected to a gate of the second transistor, and a drain connected to a gate of the first transistor; and gate driver circuits connected to the gates of the first, second and third transistors and configured to provide (i) a first drive signal to the gate of the first transistor to cause the first transistor to transition between an on state and an off state and (ii) a second drive signal to the gates of the second and third transistors to cause the second and third transistors to transition between on states and off states. The third transistor also a P-channel type is configured to prevent a shoot-through condition in the circuit by pulling the first drive signal up to a level of the source of the second transistor when the second transistor is in the on state. In some scenarios, the first, second and third transistors may be bipolar junction transistors with emitters replacing sources, collectors replacing drains, and base replacing gates.

The described features, advantages and characteristics disclosed herein may be combined in any suitable manner. One skilled in the relevant art will recognize, in light of the description herein, that the disclosed systems and/or methods can be practiced without one or more of the specific features. In other instances, additional features and advantages may be recognized in certain scenarios that may not be present in all instances.

Although the systems and methods have been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such feature may be combined with one or more other features of the other implementations as may be desired and advantageous for any given or particular application. Thus, the breadth and scope of the disclosure herein should not be limited by any of the above descriptions. Rather, the scope of the invention should be defined in accordance with the following claims and their equivalents.

We claim:

1. A circuit, comprising:
    first and second transistors connected in series;
    a third transistor comprising a source connected to a source of the second transistor, a gate connected to a gate of the second transistor, and a drain connected to a gate of the first transistor; and
    gate driver circuits connected to the gates of the first, second and third transistors and configured to provide (i) a first drive signal to the gate of the first transistor to cause the first transistor to transition between an on state and an off state and (ii) a second drive signal to the gates of the second and third transistors to cause the second and third transistors to transition between on states and off states;
    wherein the third transistor is configured to prevent a shoot-through condition in the circuit by pulling the first drive signal down to a level of the source of the second transistor when the second transistor is in the on state;
    wherein the gate driver circuits are operable to cause the third transistor to be in the on state while the first transistor is in the off state; and wherein the third transistor is configured to prevent the first transistor from being transitioned from the off state to the on state when a radiation or noise event occurs in a surrounding environment which impacts operation of the gate driver circuits.

2. The circuit according to claim 1, wherein the first transistor is in the on state when the first gate drive signal has a first voltage value and the second and third transistors are in the off states when the second gate drive signal has a second voltage value lower than the first voltage value.

3. The circuit according to claim 2, wherein the gate drive circuits are caused, by a radiation event occurring in a surrounding environment, to increase the second voltage value of the second gate drive signal.

4. The circuit according to claim 3, wherein the third transistor prevents the shoot-through condition when the second gate drive signal has an increased second voltage value.

5. The circuit according to claim 1, wherein at least the third transistor comprises a gallium nitride field effect transistor.

6. The circuit according to claim 1, wherein the third transistor is further configured to prevent the first transistor from transitioning from the off state to the on state while the third transistor is in the on state.

7. The circuit according to claim 1, where the first, second and third transistors are bipolar junction transistors with emitters replacing sources, collectors replacing drains, and bases replacing gates.

8. The circuit according to claim 1, where the first and second transistors are insulated-gate bipolar transistors with emitters replacing sources, collectors replacing drains, and the third transistor comprises a field effect transistor.

9. A circuit, comprising:
first and second transistors connected in series;
a third transistor comprising a source connected to a source of the second transistor, a gate connected to a gate of the second transistor, and a drain connected to a gate of the first transistor; and
gate driver circuits connected to the gates of the first, second and third transistors and configured to provide (i) a first drive signal to the gate of the first transistor to cause the first transistor to transition between an on state and an off state and (ii) a second drive signal to the gates of the second and third transistors to cause the second and third transistors to transition between on states and off states;
wherein the third transistor is configured to prevent a shoot-through condition in the circuit by pulling the first drive signal down to a level of the source of the second transistor when the second transistor is in the on state;
a diode configured to limit a negative voltage at the gate of the first transistor with respect to a source of the second transistor while the third transistor is being used to prevent the shoot-through condition;
wherein the diode is selectively provided in the circuit based on relative state transition speeds of the first, second and third transistors.

10. A method for operating a circuit, comprising:
providing, by a gate driver circuit, a first high drive signal to a gate of a first transistor and a first low drive signal to a gate of a third transistor and a gate of a second transistor that is connected in series with the first transistor, whereby the first transistor is transitioned to an on state and the second and third transistors are transitioned to off states;
providing a second high drive signal from the gate driver circuit concurrently to the gates of the second and third transistors to cause the second and third transistors to transition from the off states to on states while the first transistor is still in the on state; and
using the third transistor to prevent a shoot-through condition by pulling down a voltage of the first high drive signal being output from the gate driver circuit to a level that causes the first transistor to transition from the on state to an off state while the second and third transistor is in the on state;
wherein the second high drive signal is provided from the gate driver circuit responsive to a radiation or noise event in a surrounding environment.

11. The method according to claim 10, wherein the second transistor comprises a gallium nitride field effect transistor.

12. The method according to claim 10, further comprising preventing, by the third transistor, the first transistor from transitioning from the off state to the on state while the second transistor is in the on state.

13. The method according to claim 10, further comprising using a diode to limit a negative voltage at the gate of the first transistor with respect to a source of the second transistor while the third transistor is being used to prevent the shoot-through condition.

14. The method according to claim 13, further comprising selectively providing the diode in the circuit based on relative state transition speeds of the first, second and third transistors.

15. The method according to claim 10, further comprising operating the gate driver circuit to cause the third transistor to be in the on state while the first transistor is in the off state.

16. The method according to claim 15, further comprising using the second transistor to prevent the first transistor from being transitioned from the off state to the on state when a radiation event occurs in a surrounding environment which impacts operation of the gate driver circuit.

17. A circuit, comprising:
first and second transistors of a P-channel type connected in series;
a third transistor comprising a source connected to a source of the second transistor, a gate connected to a gate of the second transistor, and a drain connected to a gate of the first transistor; and
gate driver circuits connected to the gates of the first, second and third transistors and configured to provide (i) a first drive signal to the gate of the first transistor to cause the first transistor to transition between an on state and an off state and (ii) a second drive signal to the gates of the second and third transistors to cause the second and third transistors to transition between on states and off states;
wherein the third transistor also a P-channel type is configured to prevent a shoot-through condition in the circuit by pulling the first drive signal up to a level of the source of the second transistor when the second transistor is in the on state;
wherein the gate driver circuits are operable to cause the third transistor to be in the on state while the first transistor is in the off state;
wherein the third transistor is further configured to prevent the first transistor from being transitioned from the off state to the on state when a radiation or noise event occurs in a surrounding environment which impacts operations of the gate driver circuits.

18. The circuit according to claim 17, where the first, second and third transistors are bipolar junction transistors with emitters replacing sources, collectors replacing drains, and base replacing gates.

\* \* \* \* \*